(12) United States Patent
Osa

(10) Patent No.: US 11,195,707 B2
(45) Date of Patent: Dec. 7, 2021

(54) TIME-OF-FLIGHT MASS SPECTROMETRY DEVICE

(71) Applicant: SHIMADZU CORPORATION, Kyoto (JP)

(72) Inventor: Haruki Osa, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 17/058,479

(22) PCT Filed: May 31, 2018

(86) PCT No.: PCT/JP2018/021023
§ 371 (c)(1),
(2) Date: Nov. 24, 2020

(87) PCT Pub. No.: WO2019/229951
PCT Pub. Date: Dec. 5, 2019

(65) Prior Publication Data
US 2021/0202224 A1    Jul. 1, 2021

(51) Int. Cl.
*H01J 49/02* (2006.01)
*H01J 49/24* (2006.01)
*H01J 49/40* (2006.01)
*H03B 29/00* (2006.01)
*H01J 17/00* (2006.01)

(52) U.S. Cl.
CPC .......... *H01J 49/022* (2013.01); *H01J 17/005* (2013.01); *H01J 49/24* (2013.01); *H01J 49/40* (2013.01); *H03B 29/00* (2013.01); *H01J 2223/11* (2013.01)

(58) Field of Classification Search
CPC .......... H01J 49/022; H01J 49/24; H01J 49/40; H01J 17/005; H01J 2223/11; H03B 29/00
USPC ........................................................ 250/287
See application file for complete search history.

(56) References Cited

U.S. PATENT DOCUMENTS

2013/0119248 A1*  5/2013  Bowdler ................. H01J 49/26
                                                              250/282
2013/0221215 A1*  8/2013  Sherwood ................. H04L 7/00
                                                              250/281
2018/0315589 A1   11/2018  Oshiro

FOREIGN PATENT DOCUMENTS

WO        2017/068729 A1    4/2017

OTHER PUBLICATIONS

International Search Report for PCT/JP2018/021023 dated, Aug. 14, 2018 (PCT/ISA/210).
Written Opinion of the International Searching Authority for PCT/JP2018/021023 dated, Aug. 14, 2018 (PCT/ISA/237).

* cited by examiner

*Primary Examiner* — Kiet T Nguyen
(74) *Attorney, Agent, or Firm* — Sughrue Mion, PLLC

(57) ABSTRACT

A time-of-flight mass spectrometry device, includes: a flight tube: a flight tube power supply that applies a voltage to the flight tube; and a noise reduction circuit that is connected to a flight tube voltage portion which lies between the flight tube and the flight tube power supply, wherein: the noise reduction circuit inverts and amplifies an input voltage from an input end of the noise reduction circuit, and feeds inverted and amplified voltage back to the flight tube voltage portion through an output end.

6 Claims, 6 Drawing Sheets

TIME-OF-FLIGHT MASS SPECTROMETRY DEVICE

CROSS REFERENCE TO RELATED APPLICATIONS

This application is a National Stage of International Application No. PCT/JP2018/021023 filed May 31, 2018.

TECHNICAL FIELD

The present invention relates to a time-of-flight mass spectrometry device.

BACKGROUND ART

In a time-of-flight mass spectrometer (hereinafter, appropriately referred to as TOF-MS), ions are accelerated by an electric field generated by a pulse voltage and a constant voltage, and then m/z (mass-to-charge ratio) of each ion is measured based on flight time that elapses before accelerated ions are detected by an ion detector. If the pulse voltage or the constant voltage mentioned above changes unintentionally depending on measurement conditions, the measurement accuracy of the flight time will decrease. In precise mass spectrometry, because it may be required to suppress the variation in flight time depending on measurement conditions to about several ppm or less, it is necessary to improve the variation caused by various causes respectively.

As a method of suppressing such variation, for example, in Patent Literature 1 (PTL 1), variation in flight time due to voltage drop or the like of the pulse voltage, which occurs when a cycle of applying the pulse voltage changes, is reduced by changing the voltage applied to each electrode constituting the TOF-MS.

CITATION LIST

Patent Literature

PTL 1: International publication No. 2017/068729

SUMMARY OF INVENTION

Technical Problem

A constant voltage with respect to a ground of the TOF-MS (hereinafter simply referred to as ground) is applied to the flight tube, and a voltage with respect to the constant voltage applied to the flight tube is applied to the ion detector detecting ions that has flown inside the flight tube. On the other hand, a detection signal from the ion detector is output to an A/D converter or the like to which a voltage with respect to the ground is applied via a coupling capacitor. Therefore, when the detection signal is output from the ion detector, the voltage of the flight tube fluctuates according to the amount of electric charge entering and exiting the coupling capacitor. Thus, there is a problem that the flight time of ions varies due to the voltage fluctuation of the flight tube.

Solution to Problem

According to the 1st aspect of the present invention, a time-of-flight mass spectrometry device, comprises: a flight tube: a flight tube power supply that applies a voltage to the flight tube; and a noise reduction circuit that is connected to a flight tube voltage portion which lies between the flight tube and the flight tube power supply, wherein: the noise reduction circuit inverts and amplifies an input voltage from an input end of the noise reduction circuit, and feeds inverted and amplified voltage back to the flight tube voltage portion through an output end.

According to the 2nd aspect of the present invention, in the time-of-flight mass spectrometry device according to the 1st aspect, it is preferred that a first capacitative element is connected to each of the input end and the output end of the noise reduction circuit.

According to the 3rd aspect of the present invention, it is preferred that the time-of-flight mass spectrometry device according to the 1st or 2nd aspect further comprises: an ion detector that detects ions having flown in the flight tube; and a detector power supply that applies a voltage with respect to the voltage applied to the flight tube to the ion detector.

According to the 4th aspect of the present invention, in the time-of-flight mass spectrometry device according to the 3rd aspect, it is preferred that an output end of the ion detector is connected to a signal processing circuit via a second capacitative element.

Advantageous Effects of Invention

According to the present invention, it is possible to reduce the voltage fluctuation of the flight tube when the detection signal is output from the ion detector.

DESCRIPTION OF EMBODIMENTS

Hereinafter, embodiments for carrying out the present invention will be described with reference to the drawings.

First Embodiment

Figure 1:
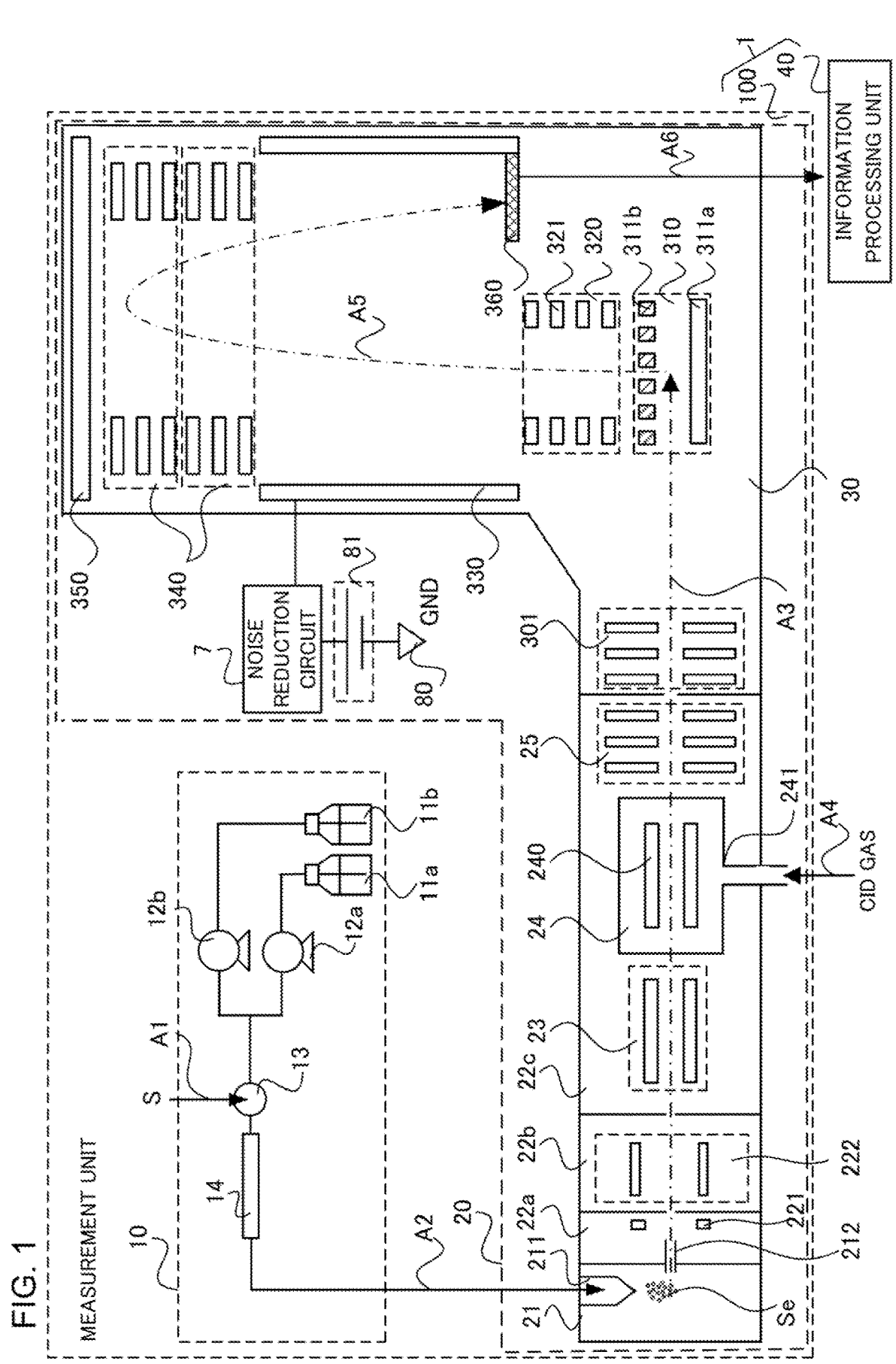
FIG. 1 is a conceptual diagram showing a configuration of a time-of-flight mass spectrometry device according to one embodiment.

FIG. 1 is a conceptual diagram for explaining a configuration of a time-of-flight mass spectrometry device according to the present embodiment. The time-of-flight mass spectrometry device 1 includes a measuring unit 100 and an information processing unit 40. The measuring unit 100 includes a liquid chromatograph 10 and a mass spectrometer 20.

The liquid chromatograph 10 includes mobile phase containers 11a and 11b, liquid feeding pumps 12a and 12b, a sample introduction unit 13, and an analytical column 14. The mass spectrometer 20 includes an ionization chamber 21 having an ionization unit 211, a first vacuum chamber 22a having an ion lens 221, a tube 212 for introducing ions from the ionization chamber 21 into the first vacuum chamber 22a, a second vacuum chamber 22b having an ion guide 222, a third vacuum chamber 22c, and an analysis chamber 30. The third vacuum chamber 22c includes a first mass separation unit 23, a collision cell 24, and an ion guide 25. The collision cell 24 includes an ion guide 240 and a CID gas introduction port 241.

The analysis chamber 30 includes an ion transport electrode 301, a first acceleration unit 310, a second acceleration unit 320, a flight tube 330, a reflectron electrode 340, a back plate 350, and a detection unit 360. The first acceleration unit 310 includes a pusher electrode 311a and a puller electrode 311b. Hereinafter, the electrodes (the pusher electrode 311a and the puller electrode 311b) included in the first acceleration unit 310 are referred to as first acceleration electrodes 311, and the electrodes included in the second acceleration unit 320 are referred to as second acceleration electrodes 321.

It is to be noted that, as long as time-of-flight mass spectrometry can be performed, the configuration of each part of the time-of-flight mass spectrometry device 1 is not particularly limited.

The type of the liquid chromatograph (LC) 10 is not particularly limited. Each of the mobile phase containers 11a and 11b includes a container capable of storing liquid such as vial, bottle or the like, and store a mobile phase having a composition different from each other. The mobile phases stored in the mobile phase containers 11a and 11b are referred to as mobile phase A and mobile phase B, respectively. The mobile phase A and the mobile phase B having been output from the liquid feeding pumps 12a and 12b, respectively, are mixed on the way of the flow path and introduced into the sample introduction unit 13. The composition of the mobile phase being introduced into the analytical column 14 changes with time as the liquid feeding pumps 12a and 12b change the flow rates of the mobile phase A and the mobile phase B, respectively.

The sample introduction unit 13 includes a sample introduction device such as an autosampler, and introduces a sample S into the mobile phase (arrow A1). The sample S introduced by the sample introduction unit 13 passes through a guard column (not shown) as appropriate and is introduced into the analytical column 14.

The analytical column 14 has a stationary phase, and each component of the introduced sample S is eluted with a retention time different from each other according to the difference in affinity of the component with the mobile phase and the stationary phase. The type of the analytical column 14 and the stationary phase are not particularly limited. The eluted sample eluted from the analytical column 14 is introduced into the ionization chamber 21 of the mass spectrometer 20 (arrow A2). It is preferable that the eluted sample from the analytical column 14 be input to the mass spectrometer 20 by online control without requiring an operation such as dispensing by a user of the time-of-flight mass spectrometry device 1 (hereinafter, simply referred to as "user").

The mass spectrometer 20 is an orthogonal acceleration type TOF-MS that performs tandem mass spectrometry on the eluted sample introduced from the analytical column 14. The path of ionized eluted sample Se is schematically shown by the arrow A3 of a long dashed short dashed line.

The ionization chamber 21 of the mass spectrometer 20 ionizes the introduced eluted sample Se. The ionization method is not particularly limited. However, in a case where liquid chromatography/tandem mass spectrometry (LC/MS/MS) is performed as in the present embodiment, an electrospray method (ESI) is preferable, and in the following embodiments, a case where the ESI is used is described. The ionized eluted sample Se emitted from the ionization unit 211 moves due to, for example, pressure difference between the ionization chamber 21 and the first vacuum chamber 22a, passes through the tube 212, and enters the first vacuum chamber 22a.

A degree of vacuum is the highest in the analysis chamber 30, followed by that of the third vacuum chamber 22c, the second vacuum chamber 22b and the first vacuum chamber 22a in this order, and the analysis chamber 30 is evacuated to a pressure of, for example, $10^{-3}$ Pa or less. Ions that have entered the first vacuum chamber 22a pass through the ion lens 221 and are introduced into the second vacuum chamber 22b. The ions that have entered the second vacuum chamber 22b pass through the ion guide 222 and are introduced into the third vacuum chamber 22c. The ions introduced into the third vacuum chamber 22c are emitted to the first mass separation unit 23. By the time the ions In enter the first mass separation unit 23, ions In are converged by electromagnetic action of the ion lens 221, ion guide 222, and the like.

The first mass separation unit 23 includes a quadrupole mass filter, selectively passes through ions of set m/z as precursor ions by electromagnetic action based on a voltage applied to the quadrupole mass filter and emits the precursor ions toward the collision cell 24.

The collision cell 24 dissociates the ionized eluted sample Se by collision induced dissociation (CID) while controlling the movement of ions by the ion guide 240, to generate fragment ions. A gas containing argon, nitrogen, or the like (hereinafter referred to as CID gas) that ions collide with during CID is introduced from the CID gas introduction port 241 so as to have a predetermined pressure in the collision cell (arrow A4). The ions containing generated fragment ions are emitted toward the ion guide 25. The ions having been passed through the ion guide 25 enter the analysis chamber 30.

The ions having entered the analysis chamber 30 pass through the ion transport electrode 301 while being controlled in movement by the ion transport electrode 301, and enter the first acceleration unit 310. The pusher electrode 311a of the first acceleration unit 310 is an acceleration electrode to which a pulse voltage having the same polarity as the polarity of ions to be detected is applied to accelerate the ions in a direction away from the pusher electrode 311a. The puller electrode 311b of the first acceleration unit 310 is formed in a grid pattern so that ions can pass through the inside thereof. The puller electrode 311b is an acceleration electrode to which a pulse voltage having a polarity opposite to the polarity of ions to be detected is applied to accelerate the ions located between the pusher electrode 311a and the puller electrode 311b towards the puller electrode 311b. The absolute value of the wave height of the pulse voltage applied to the pusher electrode 311a and the puller electrode 311b is several thousand V or the like. During a time when the pulse voltage is not applied to the pusher electrode 311a and the puller electrode 311b, a voltage having a magnitude of several tens of volts or the like is appropriately applied. The ions accelerated by the electric field generated by the pulse voltage applied to the pusher electrode 311a and the puller electrode 311b in the first acceleration unit 310 enter the second acceleration unit 320. In FIG. 1, the path of the ions accelerated by the first acceleration unit 310 is schematically shown by an arrow A5.

To the second acceleration electrode 321 of the second acceleration unit 320, a voltage of, for example, several thousand V having a polarity opposite to the polarity of ions to be detected is applied. The ions passing through the second acceleration unit 320 are accelerated by the electric field generated by the voltage applied to the second acceleration electrode 321 and enter the space surrounded by the flight tube 330.

The flight tube 330 controls the movement of the ions by the voltage applied to the flight tube 330 and defines the space in which the ions fly. To the flight tube 330, a flight tube power supply 81 connected to a ground 80 is connected. The flight tube power supply 81 applies a voltage having a polarity opposite to the polarity of the ions to be detected, and of, for example, several thousand V, to the flight tube 330. The flight tube power supply 81 measures the voltage and performs feedback control based on the measurement result to adjust the voltage to be stabilized.

A voltage higher than the voltage applied to the flight tube 330 is applied to the reflectron electrode 340 and the back plate 350 in the case of detection of positive ions, and the electric field generated by this voltage changes the traveling direction of the ions. The ions whose traveling directions have been changed move along the folded orbit schematically shown by the arrow A5 and enter the detection unit 360. It is to be noted that, in a case of detecting negative ions, a voltage lower than the voltage applied to the flight tube 330 is applied to the reflectron electrode 340 and the back plate 350.

The detection unit 360 includes an ion detector such as a microchannel plate, outputs a current signal by generating and amplifying secondary electrons corresponding to the incident ions and detect ions by the current signal as a detection signal. A detection mode may be either a positive ion mode for detecting positive ions or a negative ion mode for detecting negative ions. The detection signal obtained by detecting the ions is A/D converted by a signal processing circuit 84 (see FIG. 2) to be a digital signal, and is input to the information processing unit 40 (arrow A6).

Noise Reduction Circuit 7

A noise reduction circuit 7 suppresses voltage fluctuations in the flight tube 330. A connection to the noise reduction circuit 7 is positioned between the flight tube 330 and the flight tube power supply 81.

Figure 2:
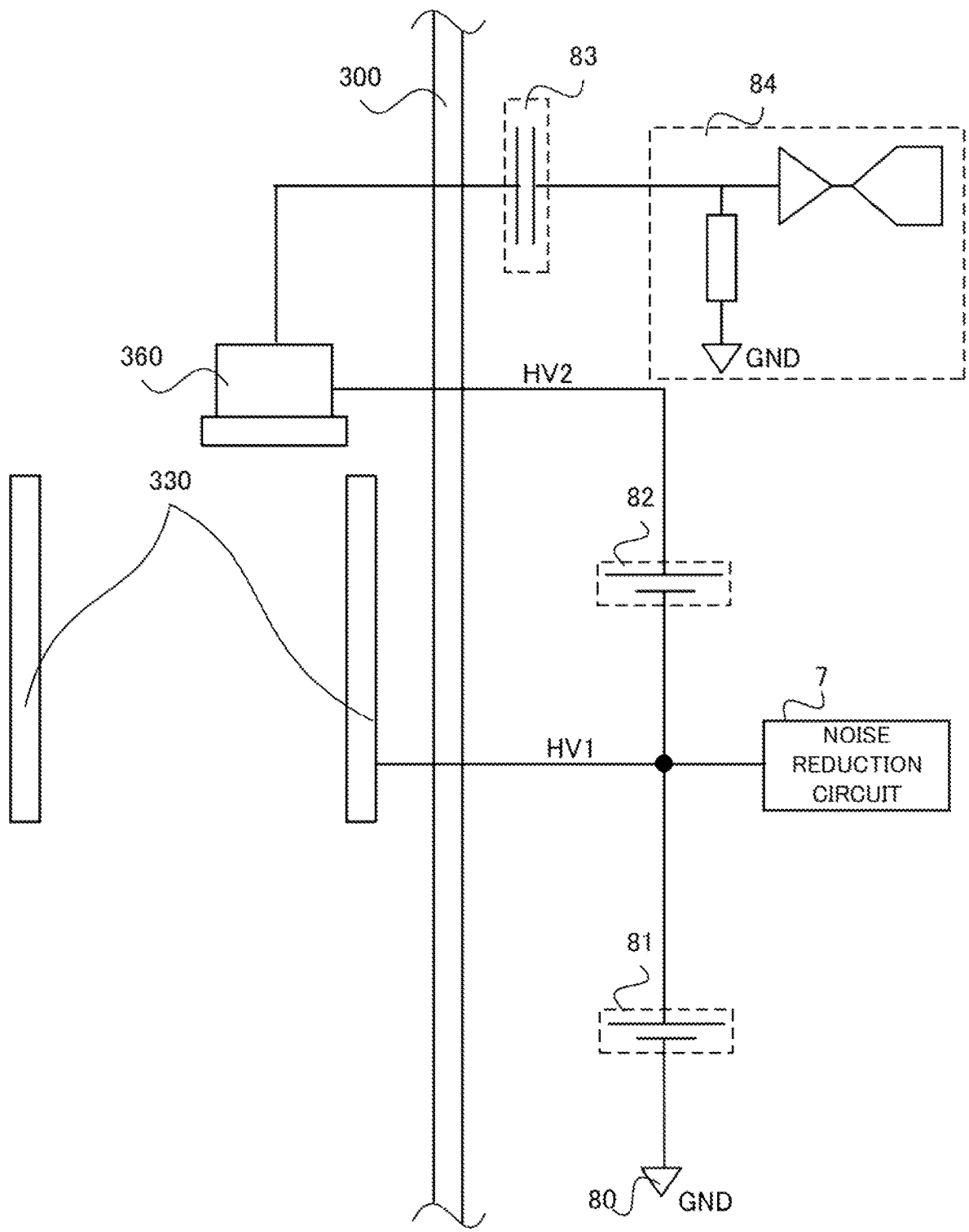
FIG. 2 is a conceptual diagram showing a configuration of a circuit for measuring flight time.

FIG. 2 is a diagram schematically showing a configuration of a circuit for measuring flight time. The time-of-flight mass spectrometry device 1 includes a detector power supply 82 arranged outside the vacuum vessel 300 which is the main body of the analysis chamber 30, the detection unit side capacitor 83 arranged on the output side of the detection unit 360, and the signal processing circuit 84 that processes the detection signal output from the detection unit 360.

The detector power supply 82 applies a voltage with respect to the voltage of the flight tube 330 (hereinafter, referred to as the flight tube voltage HV1) to the detection unit 360. The voltage applied to the detection unit 360 is called the detector voltage HV2. As the detector voltage HV2, a voltage of, for example, +several thousand V is applied with respect to the flight tube voltage HV1. In FIG. 2, the flight tube power supply 81 is represented by a symbol such that the voltage on the flight tube 330 side is higher. However, the voltage of this power supply can be reversed in polarity according to the polarity of the ions to be detected.

The detection unit side capacitor 83 is a coupling capacitor connected between the output end of the detection unit 360 and the signal processing circuit 84. The signal processing circuit 84 includes an A/D converter (not shown), converts the detection signal from the detection unit 360 into a digital signal, and outputs to the control unit 50 or the like of the information processing unit 40.

Upon the detection unit 360 detects the ions that have flown through the flight tube 330 and outputs a detection signal having, for example, a pulse shape, the charge amount of the detection unit side capacitor 83 changes. Since the detection unit 360 is connected to the flight tube side terminal of the flight tube power supply 81 via the detector power supply 82, the flight tube voltage HV1 fluctuates due to this change in the amount of electric charge. Although the flight tube voltage HV1 is feedback-controlled as described above, the response to the voltage fluctuation accompanying the detection signal is slow, so that this voltage fluctuation cannot be sufficiently reduced. The larger the amount of detected ions, the larger the voltage fluctuation of the flight tube voltage HV1. The noise reduction circuit 7 is connected to a wiring to which the flight tube voltage HV1 is applied in order to reduce this voltage fluctuation.

Figure 3:
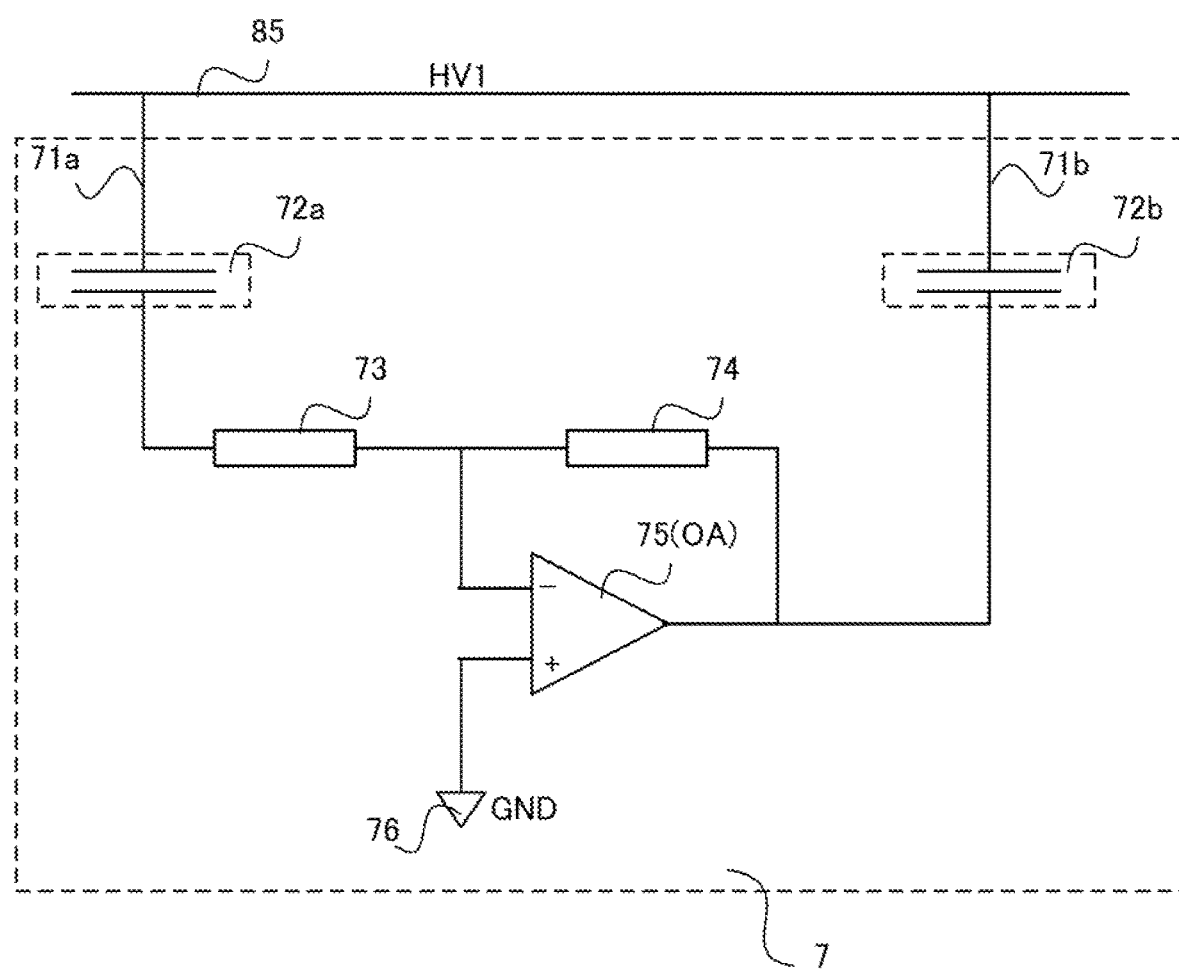
FIG. 3 is a conceptual diagram showing a configuration of a noise reduction circuit.

FIG. 3 is a diagram showing a circuit configuration of the noise reduction circuit 7. The noise reduction circuit 7 includes an input end 71*a* and an output end 71*b* each connected to a wiring 85 to which the flight tube voltage HV1 is applied, an input side capacitor 72*a*, an output side capacitor 72*b*, an input resistor 73, a feedback resistor 74, an amplification unit 75, and a ground 76. The wiring 85 is, for example, the wiring that directly connects the flight tube 330 and the flight tube power supply 81, but is not particularly limited thereto.

The input side capacitor 72*a* and the output side capacitor 72*b* are connected to the input end 71*a* and the output end 72*b*, respectively, and are arranged to take out a non-DC component from the flight tube voltage HV1 and feed it back to the wiring 85 (flight tube voltage portion). By configuring that a non-DC component is input to the noise reduction circuit 7, a voltage input to the amplification unit 75 can be reduced. Therefore, it is not necessary to complexify the configuration of the amplification unit 75 in order to output high voltage or to use a high-voltage amplifier that is difficult to obtain because, for example, the cost thereof is high.

The amplification unit 75 includes an operational amplifier OA. The inverting input terminal (−) of the operational amplifier OA is connected to the input end 71*a* via the input resistor 73 and the input side capacitor 72*a*. The non-inverting input terminal (+) of the operational amplifier OA is connected to the ground 76. The output end of the operational amplifier OA is connected to the output side capacitor 72*b*, and is also connected to the inverting input terminal (−) via the feedback resistor 74.

As described above, the noise reduction circuit 7 is configured such that the input voltage is inverted and amplified to output in the opposite phase by the negative feedback of the output of the operational amplifier OA. The gain of this inverting amplification is determined based on the ratio obtained by dividing the resistance value of the feedback resistor 74 by the resistance value of the input resistor 73. The higher this ratio is, the smaller the voltage fluctuation of the flight tube, and this ratio is preferably 2 or more, and more preferably 10 or more. In a case this ratio is too high, that is if the resistance value of the feedback resistor 74 is large, the frequency characteristics deteriorate, and if the resistance value of the input resistor 73 is small, the virtual ground is affected. Therefore, this ratio is preferably 10,000 or less. The noise reduction circuit 7 functions as a filter circuit because the voltage component is inverted and amplified based on the frequency band. The frequency characteristics of the noise reduction circuit 7 is limited by the cutoff frequency determined by, a capacitor (not shown) connected in parallel with the resistor 73 or the resistor 74, or, a capacitor (not shown) arranged for preventing oscillation (for securing a phase margin) of the operational amplifier 75, and resistance values of the resistors 73 or resistor 74. Therefore, the resistance values of the resistor 73 and resistor 74 and a ratio thereof are appropriately set according to, the capacitance value of the capacitor selected corresponding to the frequency component of noise to be removed by the noise reduction circuit, and required degree of the noise reduction.

It should be noted that the electrostatic capacitances of the input side capacitor 72a and the output side capacitor 72b, and the resistance values of the input resistor 73 and the feedback resistor 74 are set appropriately according to, for example, the frequency range in which voltage fluctuation is desired to be reduced. This range is preferably set based on the frequency and the like of the pulse voltage applied to the first acceleration voltage. Further, the circuit configuration of the noise reduction circuit 7 is not particularly limited as long as it is a circuit that inverts and amplifies the input voltage from the input end 71a and feeds it back to the output end 72a. For example, a plurality of input side capacitors 72a and a plurality of output side capacitors 72b can respectively be arranged in parallel, or a plurality of operational amplifiers OA can be arranged.

It is conceivable to connect a capacitor between the flight tube and the ground in order to suppress the voltage fluctuation of the flight tube. However, in this method, since the capacity of the connected capacitor becomes large, the switching time for reversing the voltage of the flight tube for detecting ions having different polarities becomes long, or in order not to increase this switching time, it is necessary to increase the output current capacity of the flight tube power supply. In addition, in this method, due to the capacity of the capacitor connected, an excessive surge current is generated when the degree of vacuum of the vacuum vessel that stores the flight tube deteriorates and a discharge occurs between the flight tube and the ground. As a result of this, there is a problem that the risk of damage to the ion detector, the A/D converter, and the like increases. The method of the present embodiment using the ion reduction circuit 7 does not cause such a problem.

Figure 4:
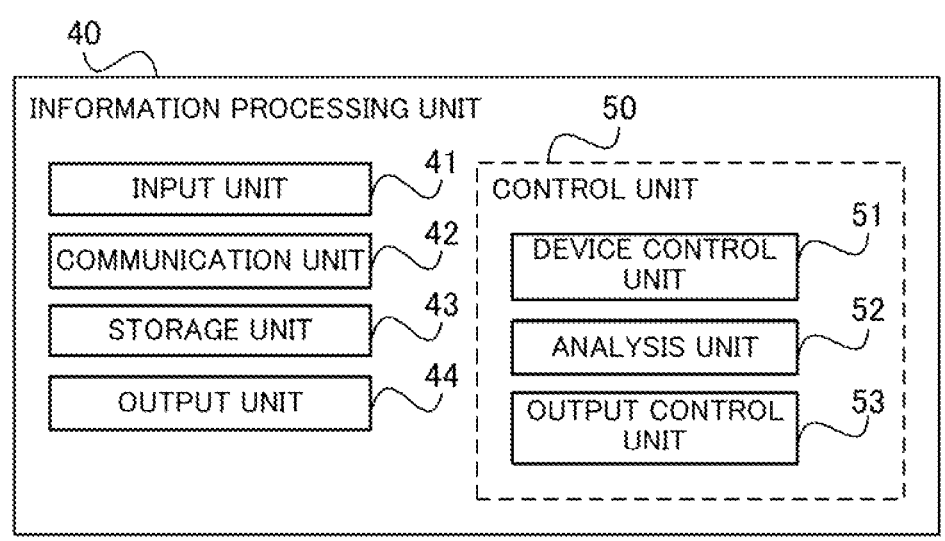
FIG. 4 is a conceptual diagram showing a configuration of an information processing unit.

FIG. 4 is a conceptual diagram showing a configuration of the information processing unit 40 of the time-of-flight mass spectrometry device 1. The information processing unit 40 includes an input unit 41, a communication unit 42, a storage unit 43, an output unit 44, and the control unit 50. The control unit 50 includes a device control unit 51, an analysis unit 52, and an output control unit 53.

The information processing unit 40 is provided with an information processing device such as a computer and serves as an interface with a user as appropriate, and also performs processing such as communication, storage, and calculation related to various data. The information processing unit 40 is a processing device that performs processing of control of the measurement unit 100, analysis and display.

It is to be noted that, the information processing unit 40 may be configured as one device integrated with the liquid chromatograph 10 and/or the mass spectrometer 20. Further, a part of the data used by the time-of-flight mass spectrometry device 1 may be stored in a remote server or the like, and a part of the arithmetic processing performed by the time-of-flight mass spectrometry device 1 may be performed by a remote server or the like. The information processing unit 40 may control the operation of each unit of the measurement unit 100, or the device constituting each unit may control the operation of each unit.

The input unit 41 of the information processing unit 40 includes an input device such as a mouse, a keyboard, various buttons, and/or a touch panel. The input unit 41 receives from the user, for example, information necessary for the measurement performed by the measurement unit 100 and the processing performed by the control unit 50.

The communication unit 42 of the information processing unit 40 includes a communication device capable of communicating by a wireless or wired connection via a network such as the internet. The communication unit 42 appropriately transmits and receives necessary data. For example, the communication unit 42 receives data necessary for measurement by the measurement unit 100 and transmits data processed by the control unit 50 such as the analysis result of the analysis unit 52.

The storage unit 43 of the information processing unit 40 includes a non-volatile storage medium. The storage unit 43 stores, measurement data based on the detection signal output from the detection unit 360 and a program for the control unit 50 to execute processing, and the like.

The output unit 44 of the information processing unit 40 includes a display device such as a liquid crystal monitor, and/or a printer. The output unit 44 is controlled by the output control unit 53 and outputs information on the measurement of the measurement unit 100, analysis results of the analysis unit 52, and the like by displaying on the display device or printing on a print medium.

The control unit 50 of the information processing unit 40 includes a processor such as a CPU. The control unit 50 performs various processes by executing a program stored in the storage unit 43 or the like, such as controlling the measurement unit 100 or analyzing measurement data.

The device control unit 51 of the control unit 50 controls the measurement operation of the measurement unit 100 based on measurement conditions and the like set according to the input and the like via the input unit 41. The device control unit 51 controls voltages applied to the first acceleration electrode 311, the second acceleration electrode 321 and the flight tube 330. For example, the device control unit 51 inverts the voltages applied to the second acceleration electrode 321 and the flight tube 330 according to the polarity of the ions to be detected.

The analysis unit 52 analyzes the measurement data. The analysis unit 52 converts a flight time of the detection signal that has been output from the detection unit 360 and A/D converted in the signal processing circuit 84 into m/z based on a calibration data acquired in advance, and makes m/z of the detected ions corresponds to the detection intensity. The analysis unit 52 creates data corresponding to a mass chromatogram in which a retention time corresponds to a detection intensity, or creates data corresponding to a mass spectrum in which m/z corresponds to a detection intensity. The analysis method performed by the analysis unit 52 is not particularly limited.

The output control unit 53 creates an output image including measurement conditions of the measurement unit 100, analysis result of information of the analysis unit 52 such as the mass chromatogram or the mass spectrum, or the like, and outputs the output image to the output unit 44.

According to the above-described embodiment, the following effects can be obtained.
(1) The time-of-flight mass spectrometry device 1 according to the present embodiment, comprises: the flight tube 330; the detection unit 360; the flight tube power supply 81 that applies a voltage to the flight tube 330; and the noise reduction circuit 7 that is connected to the flight tube voltage portion (wiring 85) which lies between the flight tube 330 and the flight tube power supply 81, wherein: the noise reduction circuit 7 inverts and amplifies an input voltage from the input end 71a of the noise reduction circuit 7, and feeds inverted and amplified voltage back to the flight tube voltage portion through the output end 71b. Accordingly, fluctuation of the flight tube voltage HV1 caused when a detection signal is output from the detection unit 360 can be suppressed. Moreover, as compared with the case where the grounded capacitor and the flight tube 330 are connected to suppress the voltage fluctuation, the time-of-flight mass spectrometer 1 can reduce the influence of the capacitance of the arranged capacitor. Therefore, in the case of changing a polarity of the ions to be detected, switching time for changing the voltage of the flight tube 330 can be shortened. Further, even when a degree of vacuum of the vacuum vessel 300 that stores the flight tube 330 deteriorates and a discharge occurs between the flight tube 330 and the ground 80, an excessive surge current is not generated, and thus the risk of damage to the ion detector, the A/D converter and the like can be reduced.

It is to be noted that "connected to the flight tube voltage portion which lies between the flight tube 330 and the flight tube power supply 81" does not mean it is necessary to be connected by a wiring that directly connects the flight tube 330 and the flight tube power supply 81, and it suffices as long as the flight tube voltage HV1 can be controlled by the noise reduction circuit 7.

(2) In the time-of-flight mass spectrometry device 1 according to the present embodiment, to the input end 71a and the output end 71b of the noise reduction circuit 7, the input side capacitor 72a and the output side capacitor 72b as capacitative elements are respectively connected. Accordingly, the non-DC component is extracted from the flight tube voltage HV1 and input to the noise reduction circuit 7. Therefore, it is not necessary to complexify the configuration of the amplification unit 75 in order to output a high voltage or to use a high-voltage amplifier that is difficult to obtain.

(3) The time-of-flight mass spectrometry device 1 according to the present embodiment further comprises the detector power supply 82 that applies a voltage with respect to the voltage applied to the flight tube 330 to the detection unit 360. In a case where the flight tube power supply and the detector power supply are arranged in separate circuits, when the flight tube voltage is inverted in order to detect ions having a different polarity, an unnecessary signal is detected due to the time gap. By the above configuration, this problem can be prevented.

(4) In the time-of-flight mass spectrometry device 1 according to the present embodiment, the output end of the detection unit 360 is connected to the signal processing circuit 84 via the detection unit side capacitor 83 as a capacitative element. Accordingly, the signal component is passed through while the DC current is cut off by the detection unit side capacitor 83, so that the signal processing circuit 84 can efficiently perform signal processing.

The following Variations are also within the scope of the present invention and can be combined with the above embodiments. In the following Variations, the parts showing the same structure and function as those in the above-described embodiment will be referred to by the same reference signs, and the description thereof will be omitted as appropriate.

Variation 1

The time-of-flight mass spectrometry device 1 according to the above-described embodiment is a liquid chromatograph-tandem mass spectrometer. However, the time-of-flight mass spectrometry device 1 does not have to include a liquid chromatograph, and may include a separation analytical device other than a liquid chromatograph. The mass spectrometer 20 may be a TOF-MS that is not a tandem mass spectrometer. Moreover, the mass spectrometer 20 may be a TOF-MS other than the orthogonal acceleration type as shown in FIG. 1. Further, the mass spectrometer 20 may be a linear type or a multi-turn type TOF-MS instead of the reflectron type as shown in FIG. 1.

The present invention is not limited to the contents of the above embodiments. Other aspects conceivable within the scope of the technical idea of the present invention are also included within the scope of the present invention.

EXAMPLES

In the Examples described below, by using a TOF-MS, a standard sample with known m/z was detected and change in flight tube voltage during the detection was measured, in a condition that, the frequency of a pulse voltage applied to a first acceleration electrode (hereinafter referred to as pulse frequency) is 2 kHz, an ionization voltage is +4 kV, and a flight tube voltage and a detector voltage are 7 kV and 2.5 kV respectively.

It is to be noted that the present invention is not limited to the numerical values and conditions shown in the below-described example.

Comparative Example 1

Mass spectrometry of the standard sample was performed using a TOF-MS having the same circuit configuration as in FIG. 2 except that the noise reduction circuit 7 was not provided.

Figure 5A:
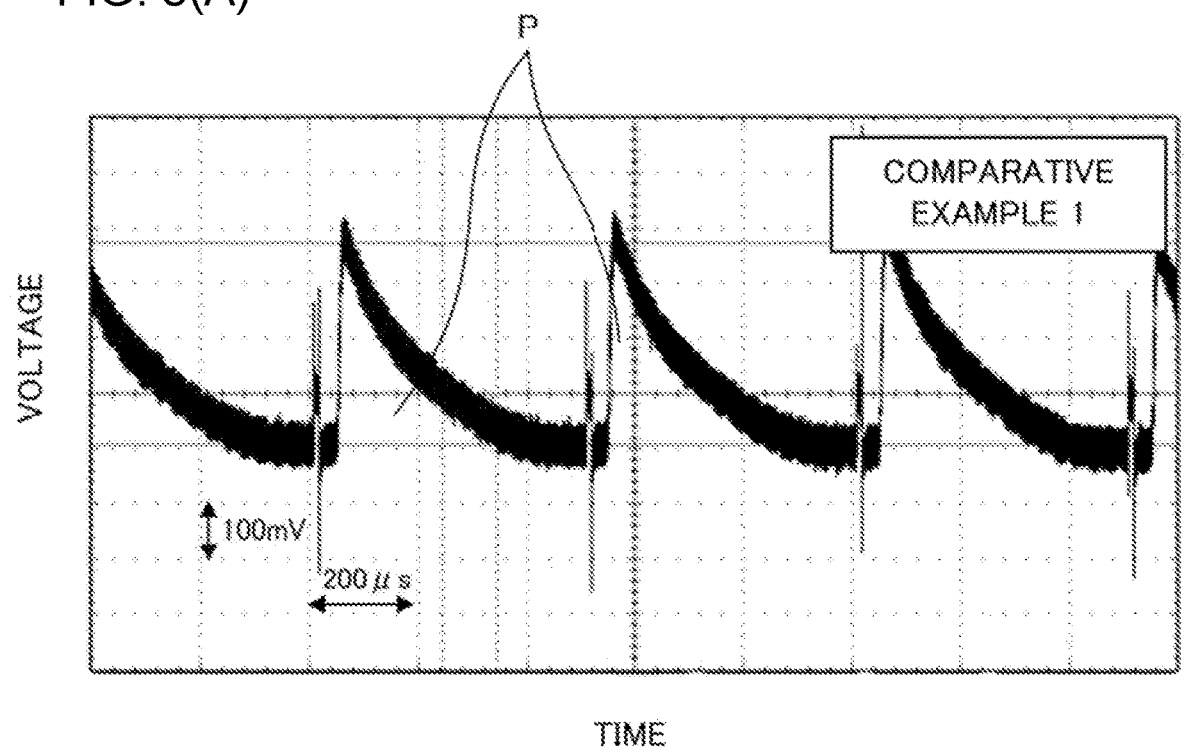
FIG. 5(A) is a graph showing a voltage of a flight tube in Comparative Example 1.

FIG. 5(A) is a graph showing the change in the flight tube voltage when a standard sample was being detected. A peak P was observed approximately every 500 μs based on the pulse frequency (2 kHz). The peak P corresponds to the fluctuation of the flight tube voltage HV1 associated with outputting of the detection signal from the detection unit 360.

Comparative Example 2

Mass spectrometry of the standard sample was performed using a TOF-MS having the same circuit configuration as in FIG. 2 except that the noise reduction circuit 7 was not provided and a capacitor having a capacitance of 10 nF was connected in parallel with the flight tube power supply 81.

Figure 5B:
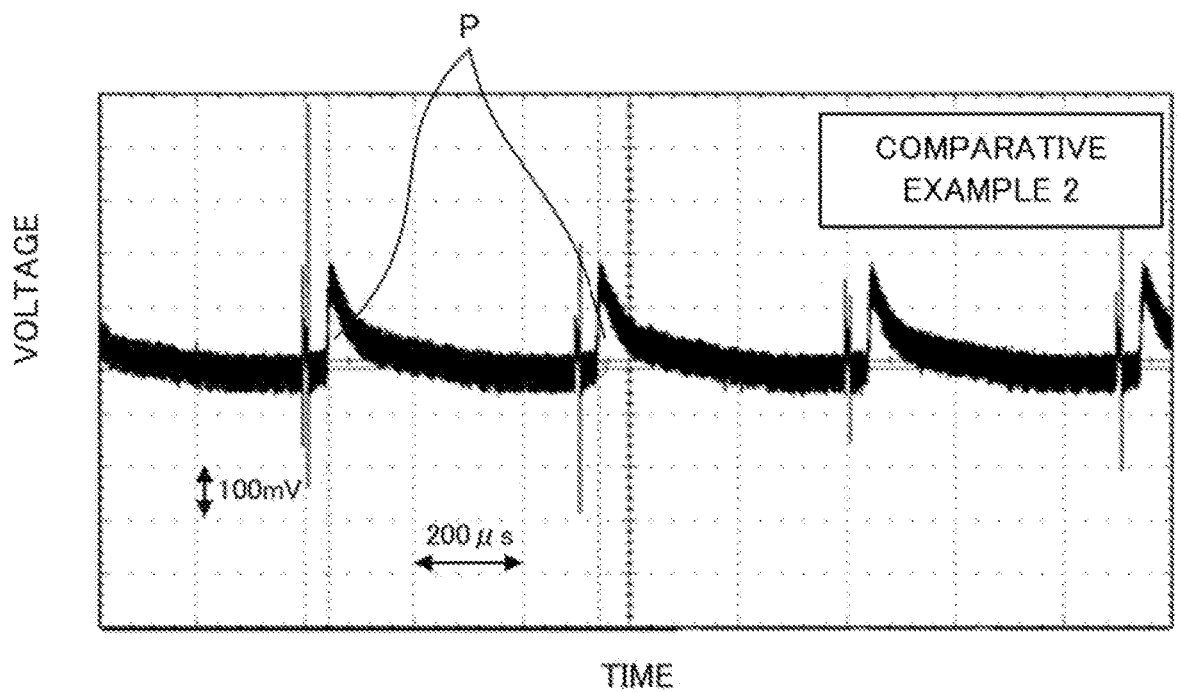
FIG. 5(B) is a graph showing a voltage of a flight tube in Comparative Example 2.

FIG. 5 (B) is a graph showing the change in the flight tube voltage when a standard sample was being detected. Although magnitude of peaks P corresponding to the fluctuation of the flight tube voltage HV1 associated with outputting of the detection signal from the detection unit 360 was smaller than that in the case of Comparative Example 1, they were still remarkably observed.

Example 1

Mass spectrometry of the standard sample was performed using a TOF-MS having the same circuit configuration as shown in FIG. 2 and FIG. 3. In the noise reduction circuit 7, a plurality of capacitors were arranged at the input end 71a so that the total capacitance was 2 nF, and a plurality of capacitors were arranged at the output end 71b so that the total capacitance was 8 nF. The input resistor 73 was set to 1 kΩ, and the feedback resistor 74 was set to 390 kΩ.

Figure 6:
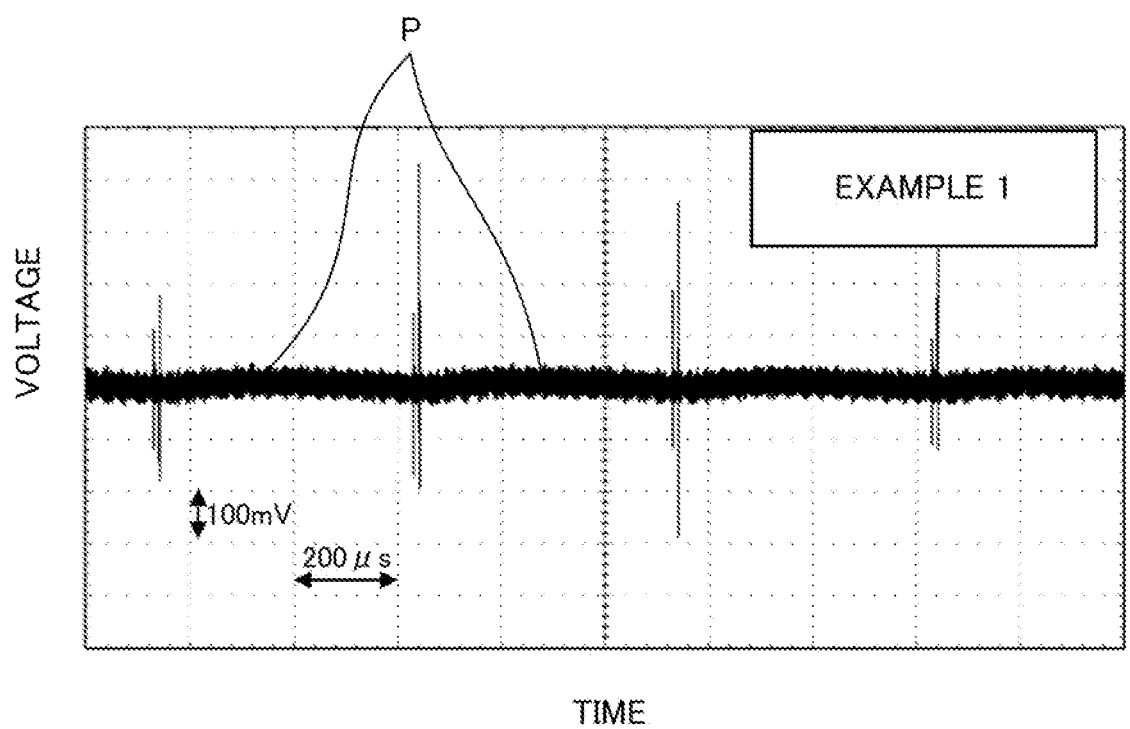
FIG. 6 is a graph showing a voltage of a flight tube in an Example.

FIG. 6 is a graph showing the change in the flight tube voltage when the standard sample was being detected in the Example 1. The magnitude of peaks P corresponding to the fluctuations of the flight tube voltage HV1 associated with outputting of the detection signal from the detection unit 360 was further reduced as compared with the case of Comparative Example 2.

REFERENCE SIGNS LIST

1 . . . Time-of-flight Mass Spectrometry Device, 7 . . . Noise Reduction Circuit,
10 . . . Liquid Chromatograph, 14 . . . Analytical Column, 20 . . . Mass Spectrometer,
21 . . . Ionization Chamber, 23 . . . First Mass Separation Unit, 24 . . . Collision Cell,
30 . . . Analysis Chamber, 40 . . . Information Processing Unit, 50 . . . Control Unit,
71a . . . Input End, 71b . . . Output End, 72a . . . Input Side Capacitor,
72b . . . Output Side Capacitor, 73 . . . Input Resistor, 74 . . . Feedback Resistor,
75 . . . Amplification Unit, 76, 80 . . . Ground, 81 . . . Flight Tube Power Supply,
82 . . . Detector Power Supply, 83 . . . Detection Unit Side Capacitor,
84 . . . Signal Processing Circuit, 100 . . . Measurement Unit,
300 . . . Vacuum Vessel, 310 . . . First Acceleration Unit,
320 . . . Second Acceleration Unit, 330 . . . Flight Tube, 340 . . . Reflectron Electrode,
360 . . . Detection Unit, OA . . . Operational Amplifier, S . . . Sample.

The invention claimed is:

1. A time-of-flight mass spectrometry device, comprising:
a flight tube:
a flight tube power supply that applies a voltage to the flight tube; and
a noise reduction circuit that is connected to a flight tube voltage portion which lies between the flight tube and the flight tube power supply, wherein:
the noise reduction circuit inverts and amplifies an input voltage from an input end of the noise reduction circuit, and feeds inverted and amplified voltage back to the flight tube voltage portion through an output end.

2. The time-of-flight mass spectrometry device according to claim 1, wherein:
a first capacitative element is connected to each of the input end and the output end of the noise reduction circuit.

3. The time-of-flight mass spectrometry device according to claim 2, further comprising:
an ion detector that detects ions having flown in the flight tube; and
a detector power supply that applies a voltage with respect to the voltage applied to the flight tube to the ion detector.

4. The time-of-flight mass spectrometry device according to claim 3, wherein:
an output end of the ion detector is connected to a signal processing circuit via a second capacitative element.

5. The time-of-flight mass spectrometry device according to claim 1 or 2, further comprising:
an ion detector that detects ions having flown in the flight tube; and
a detector power supply that applies a voltage with respect to the voltage applied to the flight tube to the ion detector.

6. The time-of-flight mass spectrometry device according to claim 5, wherein:
an output end of the ion detector is connected to a signal processing circuit via a second capacitative element.

\* \* \* \* \*